United States Patent

Rangappan

Patent Number: 5,256,899
Date of Patent: Oct. 26, 1993

[54] INTEGRATED CIRCUIT FUSE LINK HAVING AN EXOTHERMIC CHARGE ADJACENT THE FUSE PORTION

[75] Inventor: Anikara Rangappan, Torrance, Calif.

[73] Assignee: Xerox Corporation, Stamford, Conn.

[21] Appl. No.: 813,176

[22] Filed: Dec. 24, 1991

[51] Int. Cl.5 .................. H01L 29/34; H01L 23/48; G11C 17/00; H01H 37/76
[52] U.S. Cl. ........................ 257/665; 257/529; 307/202.1; 365/96
[58] Field of Search ............ 357/54, 71, 75, 85, 357/51; 361/534, 26, 32; 337/1, 182; 257/792, 173, 529, 665, 910; 365/96; 307/202.1

[56] References Cited

U.S. PATENT DOCUMENTS

| | | | |
|---|---|---|---|
| 3,575,681 | 4/1971 | Nusbaum | 357/75 |
| 3,725,671 | 4/1973 | Keister et al. | 357/85 |
| 4,107,762 | 8/1978 | Shirn et al. | 357/72 |

Primary Examiner—Andrew J. James
Assistant Examiner—Carl Whitehead, Jr.
Attorney, Agent, or Firm—Daniel J. O'Neill

[57] ABSTRACT

A fuse link includes a fuse portion and a exothermic charge adjacent the fuse portion for blowing the fuse portion upon application of a triggering current to the fuse link.

4 Claims, 1 Drawing Sheet

INTEGRATED CIRCUIT FUSE LINK HAVING AN EXOTHERMIC CHARGE ADJACENT THE FUSE PORTION

BACKGROUND AND INFORMATION DISCLOSURE STATEMENT

This invention relates to a fuse link, and more particularly to an integrated circuit fuse link and a method for making the integrated circuit fuse link.

Typically a integrated circuit fuse link consists of a conductive trace, made of metal or conductive polysilicon, that includes a fuse portion. The fuse portion is thinner or narrower than the rest of the trace, and thus experiences a higher current density. The fuse link is blown by subjecting the fuse link to a current pulse that heats the material of the fuse portion sufficiently to vaporize a gap in the fuse portion, creating an open circuit.

The present fuse links have generally performed adequately. One drawback, however, is that blowing the fuse links requires applying a relatively large current: Normally, to blow a fuse portion that is 3 to 4 micrometers wide requires applying a current pulse to the fuse link of from 300 to 500 milliamp. Another drawback is that applying a simple pulse sometimes only vaporizes a small gap in the fuse portion. The small gap opens the circuit, preventing the pulse from causing further heating, and thus from widening the gap. After the pulse is no longer applied to the fuse link, into the gap can settle conductive fragments of the vaporized fuse portion. In sufficient quantity, the fragments can bridge the gap. The bridge may suffice to repair the gap for the relatively small currents (e.g., 20 milliamps) to which the fuse link is subjected under normal operating conditions.

One approach to the problem of gap bridging is to create larger gaps. Presently larger gaps are created by changing the current applied to the fuse link from a simple pulse to a more complex waveform. The complex current waveform typically includes a slow ramping up to the maximum current. The more complex current waveform, however, takes longer to apply to each fuse link. Time is a consideration, since programming a fuse link EPROM may require blowing thousands of fuse links. The complex current waveform also requires complex equipment to generate.

SUMMARY OF THE INVENTION

The present invention is directed to a fuse link having a fuse portion and a exothermic charge adjacent the fuse portion for blowing the fuse portion upon application of a triggering current to the fuse link.

According to another aspect of the invention, the fuse link includes leads that attach to opposite ends of the fuse portion, the leads and fuse portion are constructed from conductive traces, the fuse portion includes a region narrower than the leads for providing a higher current density, and the exothermic charge is located over the narrow region of the fuse portion.

According to another aspect of the invention, a method of constructing a fuse link is described that includes the steps of forming the leads and the fuse portion, then forming the exothermic charge over the fuse portion by applying, patterning a highly exothermic (i.e., near explosive) photoresist.

Other aspects of the invention will become apparent from the following description with reference to the drawings, wherein:

DETAILED DESCRIPTION OF THE PREFERRED EMBODIMENT

Figure 1:
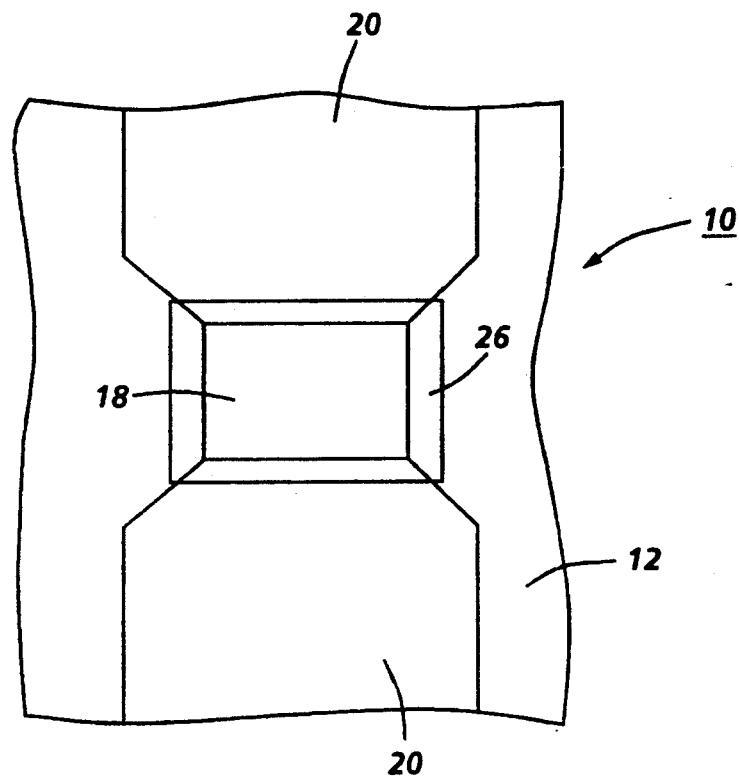
FIG. 1 is a plan view of a fuse link embodying the present invention, showing the exothermic charge and the fuse portion.
Figure 2:
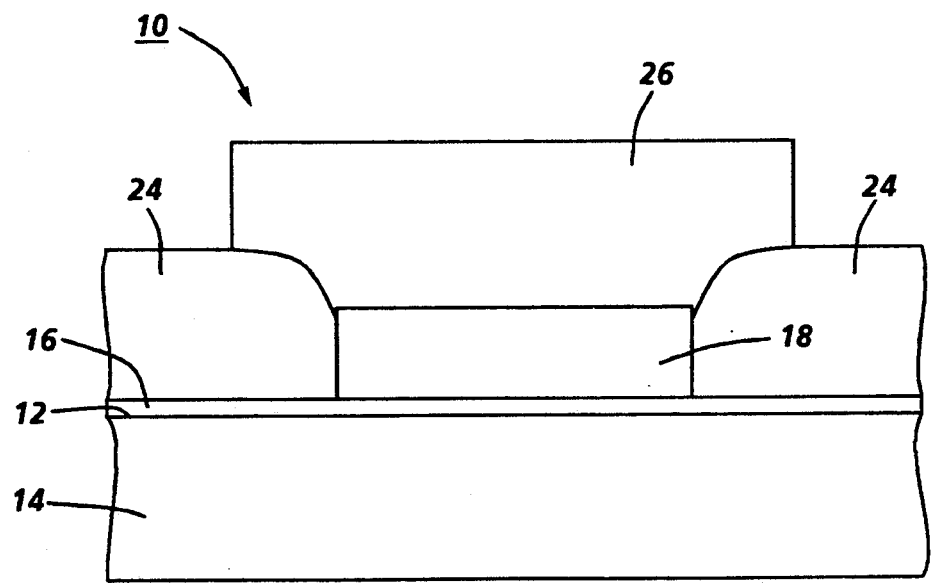
FIG. 2 is a cross sectional elevational view showing the exothermic charge and the fuse portion.

Referring now to FIGS. 1 and 2, there is shown a fuse link 10 embodying the present invention. Fuse link 10 is constructed above the major surface 12 of a substrate 14. Preferably substrate 14 is a semiconductor substrate, such as a silicon crystal. Alternatively, substrate 14 could be ceramic, sapphire, or other suitable material. According to the method of the present invention, fuse link 10 is constructed by depositing a first passivation layer 16 on major surface 12. Preferably, first passivation layer 16 consists of one micrometer thick layer of thermally grown or deposited silicon dioxide. Next, a conductive layer is deposited, patterned and etched to form fuse portion 18 and leads 20. The conductive layer preferably consists of a one micrometer thick layer of deposited aluminum, or a one micrometer thick layer of polysilicon that is doped with impurities in a quantity sufficient to make it conductive. Leads 20 attach to opposite ends of fuse portion 18 to connect fuse portion 18 to other circuit elements (not shown), which are located either on or external to substrate 14. Leads 20 are twenty micrometer wide conductive traces. Fuse portion 18 is generally less than ten micrometers wide, and typically three to four micrometers wide. However, at the ends that connect to leads 20, fuse portion 18 expands to the width of leads 20. Fuse portion 18 is generally narrower than leads 20 to provide the narrower regions of fuse portion 18 with higher current densities than leads 20.

After leads 20 and fuse portion 18 are formed, a second passivation layer 24 is deposited. Second passivation layer 24 preferably consists of a one micrometer thick layer of deposited silicon dioxide or silicon nitride. Second passivation layer 24 is then patterned and etched to uncover or expose fuse portion 18.

Next a layer of exothermic photoresist, preferably about two micrometers thick, is deposited, patterned and etched to form exothermic charge 26. Preferably, the exothermic photoresist consists of a conventional photoresist, such as AZ-1350, mixed with an explosive, such as nitrocellulose or cellulose acetate buterate, that dissolves in the same solvent structure as the photoresist. Ideally, the resulting photoresist is exothermic nearly to the point of being explosive. Like conventional photoresist, the exothermic photoresist is deposited, patterned and exposed (i.e., cured). Finally the unexposed exothermic photoresist removed, leaving the exothermic charge 26 located over fuse portion 18.

Exothermic charge 26 heats fuse portion 18 upon receipt by fuse portion 18 of a triggering current pulse. The pulse should be of sufficient magnitude and duration to heat fuse portion 18 to the detonation temperature of exothermic charge 26. A typical detonation temperature is about 200 degrees centigrade, and would require a pulse of about 50 to 100 milliamps applied for a sufficient time. Since the detonation temperature is well below the melting temperatures of typical conductive materials used to construct fuse portion 18 (e.g., aluminum has a typical melting temperauture of 400 degrees cetigrade and conductive polysilicon has a typical melting temperature of about 1415 degrees centigrade), there is little likelihood that a small, pulse-stopping gap will open in fuse portion 18 before charge 26 is detonated. Moreover, since charge 26 covers most, if not all, of fuse portion 18, detonation of charge 26 will open a gap in fuse portion 18 too large to be bridged by fragments.

An alternative to triggering exothermic charge 26 with a current pulse is to trigger charge 26 with a laser beam. A laser beam, such as one used to trim integrated circuit resistors, could be selectively directed onto charge 26, heating charge 26 to detonation.

While the invention has been described with reference to the structures disclosed, it is not confined to the specific details set forth, but is intended to cover such modifications or changes as may come within the scope of the claims.

What is claimed is:

1. An integrated circuit fuse link, including:
   a fuse portion capable of generating heat in response to an applied current; and
   an exothermic charge positioned adjacent to the fuse portion for blowing the fuse portion, the exothermic charge including exposed photoresist and explosive material, the explosive material being capable of detonating in response to heat generated by the fuse portion.

2. The integrated circuit fuse link of claim 1, wherein the explosive material includes nitrocellulose.

3. The integrated circuit fuse link of claim 1, wherein the explosive material includes cellulose acetate buterate.

4. The integrated circuit fuse link of claim 1, wherein the explosive material detonates in response to heat from the fuse portion that is generated by the fuse portion at a temperature less than the melting temperature of the fuse portion.

* * * * *